(12) United States Patent
Huang et al.

(10) Patent No.: US 7,400,480 B2
(45) Date of Patent: Jul. 15, 2008

(54) ELECTROSTATIC DISCHARGE PROTECTION CIRCUIT

(75) Inventors: Cheng-Hsiung Huang, Cupertino, CA (US); Guu Lin, San Jose, CA (US); Shih-Lin S. Lee, San Jose, CA (US); Chih-Ching Shih, Pleasanton, CA (US); Irfan Rahim, San Jose, CA (US); Stephanie T. Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/890,933

(22) Filed: Aug. 7, 2007

(65) Prior Publication Data
US 2007/0279817 A1 Dec. 6, 2007

Related U.S. Application Data

(63) Continuation of application No. 10/861,604, filed on Jun. 3, 2004, now Pat. No. 7,271,989.

(51) Int. Cl.
*H02H 3/22* (2006.01)
(52) U.S. Cl. ......................... 361/56; 361/111
(58) Field of Classification Search .............. 361/56, 361/91.1, 111; 326/8; 327/525
See application file for complete search history.

(56) References Cited

U.S. PATENT DOCUMENTS

| | | | |
|---|---|---|---|
| 5,990,723 A | 11/1999 | Tanase | |
| 6,034,552 A | 3/2000 | Chang et al. | |
| 6,169,312 B1 | 1/2001 | Hiraga | |
| 6,249,410 B1 | 6/2001 | Ker et al. | |
| 6,327,125 B1 | 12/2001 | Colclaser et al. | |
| 6,329,863 B1 | 12/2001 | Lee et al. | |
| 6,430,016 B1 | 8/2002 | Marr | |
| 6,624,992 B1 | 9/2003 | Aparin | |
| 6,882,214 B2 * | 4/2005 | Spenea et al. | 327/525 |
| 2006/0132992 A1 * | 6/2006 | Laville et al. | 361/18 |

OTHER PUBLICATIONS

Hun-Hsien Chang et al., "Improved Output ESD Protection by Dynamic Gate Floating Design" IEEE Transactions on Electron Devices, vol. 45, No. 9, Sep. 1998, pp. 2076-2078.

* cited by examiner

*Primary Examiner*—Michael J Sherry
*Assistant Examiner*—Danny Nguyen
(74) *Attorney, Agent, or Firm*—Treyz Law Group; G. Victor Treyz

(57) ABSTRACT

Integrated circuits are provided that have sensitive circuitry such as programmable polysilicon fuses. Electrostatic discharge (ESD) protection circuitry is provided that prevents damage or undesired programming of the sensitive circuitry in the presence of an electrostatic discharge event. The electrostatic discharge protection circuitry may have a power ESD device that limits the voltage level across the sensitive circuitry to a maximum voltage and that draws current away from the sensitive circuitry when exposed to ESD signals. The electrostatic discharge protection circuitry may also have an ESD margin circuit that helps to prevent current flow through the sensitive circuitry when the maximum voltage is applied across the sensitive circuitry.

11 Claims, 7 Drawing Sheets

US 7,400,480 B2

ELECTROSTATIC DISCHARGE PROTECTION CIRCUIT

This application is a continuation of patent application Ser. No. 10/861,604, filed Jun. 3, 2004 now U.S. Pat. No. 7,271,989, which is hereby incorporated by reference herein in its entirety.

BACKGROUND OF THE INVENTION

This invention relates to circuitry for protecting integrated circuit components such as fuses from damage due to electrostatic discharge.

Integrated circuits are often exposed to potentially damaging electrostatic charges. For example, a wafer of integrated circuits may be exposed to electric charges during fabrication. Such charges may arise from the use of plasma etching techniques or other processes that produce charged particles. As another example, a packaged integrated circuit may be exposed to electrostatic charges when a worker inadvertently touches exposed pins on the circuit's package or when the package becomes charged electrostatically due to movement of the package in a tray.

These electrostatic charges can damage sensitive circuitry. For example, transistors and other electrical devices on an integrated circuit can be damaged when exposed to excessive currents.

Some integrated circuits have programmable fuses or antifuses. Fuses and antifuses may be used, for example, to selective switch redundant circuitry into use in place of defective circuitry. Fuses and antifuses may also be used to store information on an integrated circuit (e.g., a secret key, a serial number, etc.). If exposed to unwanted currents, the fuses or antifuses on an integrated circuit may be inadvertently programmed. Inadvertent programming of the fuses or antifuses may render the circuit inoperable.

It would therefore be desirable to provide circuitry for protecting integrated circuits against the harmful effects of electrostatic discharge.

SUMMARY OF THE INVENTION

Integrated circuits are provided that have sensitive circuitry that could be harmed during an electrostatic discharge (ESD) event. The sensitive circuitry may include sensitive electronic devices such as transistors that could be damaged by excessive currents or may include devices such as programmable fuses or antifuses whose states could be inadvertently changed during an ESD event.

Electrostatic discharge protection circuitry is provided to protect the sensitive circuitry during an ESD event. The electrostatic discharge protection circuitry may include a power ESD device that limits the voltage levels across the sensitive circuitry to a maximum voltage and that draws current away from the sensitive circuitry. The electrostatic discharge protection circuitry may also include an ESD margin circuit. The ESD margin circuit helps to ensure that current does not flow through the sensitive circuitry, even when the maximum voltage is applied across the sensitive circuitry.

The power ESD device may be based on an n-channel metal-oxide-semiconductor (NMOS) transistor that is provided with a soft-ground bias by another NMOS transistor. The ESD margin circuit may be based on a p-channel metal-oxide-semiconductor (PMOS) integrated circuit that is connected in series with the sensitive circuitry.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
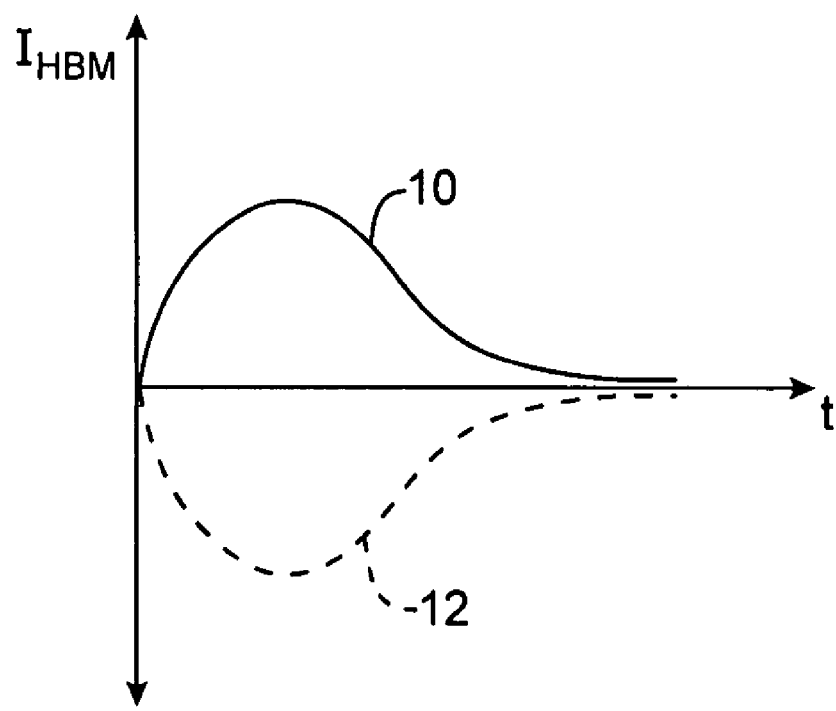
FIG. 1 is a graph showing typical current signals that may be produced due to electrostatic discharge arising from human contact with the pins of an integrated circuit.

Integrated circuits are often exposed to electrostatic charges. For example, if a person inadvertently touches the pins of an integrated circuit, the devices within the integrated circuit may be exposed to electrostatic charge through the person's skin. Electrostatic charges may also develop as an integrated circuit is processed or during handling.

The large currents that develop during an electrostatic discharge event may damage circuitry on the integrated circuit. Moreover, electrically programmable elements such as programmable fuses or antifuses may be inadvertently set to an improper state.

The present invention relates to ways to protect integrated circuits from the undesirable effects of electrostatic discharge. In particular, the invention relates to circuitry for preventing sensitive devices from being exposed to undesirably high currents. The invention may be used to protect any suitable integrated circuit component such as a transistor, diode, resistor, capacitor, etc. The invention may also be used to prevent programmable devices such as programmable fuses and antifuses from exposure to signals that might lead to inadvertent programming. For clarity, the present invention is sometimes described in the context of electrostatic discharge protection circuitry that is used to protect polysilicon fuses from undesired programming operations. This is, however, merely illustrative. The electrostatic discharge protection arrangement of the present invention may be used to protect any other sensitive circuitry if desired.

Programmable fuses and antifuses are used in a variety of integrated circuit applications. For example, a programmable logic device may have logic that is customized by programming appropriate fuses or antifuses on the device. Fuses and antifuses may also be used to permanently switch redundant circuitry into place to fix reparable defects during the integrated circuit manufacturing process. If desired, the values of certain electrical devices such as resistors may be customized by programming fuses or antifuses. Sometimes it may be desired to use fuses or antifuses to store information on a circuit such as a secret key, a serial number, etc.

Laser-programmable fuses are often used for integrated circuits that have aluminum interconnects. With this type of arrangement, polysilicon and aluminum fuses can be blown open by focusing a precisely-aligned laser beam on the appropriate fuses. Because each fuse must be serially-programmed, the laser programming process can be lengthy. The programming equipment used in laser-based systems may also be complex and expensive.

Electrically programmable fuses and antifuses are attractive because the need for laser-based programming equipment is eliminated and programming speeds can generally be increased. However, electrically programmable fuses are subject to inadvertent programming due to the voltages that arise during unexpected electrostatic discharge events.

Electrostatic discharge events can be classified using the "human body model" and the "charged device model." Typical discharge times for both types of events are on the order of nanoseconds or less, leading to potentially large and damaging currents within the integrated circuit.

The human body model (HBM) is applicable to scenarios in which electrostatic discharge arises from the transfer of electrostatic charge from a human or other charged object to the integrated circuit. This type of situation may arise, for example, when a person simultaneously touches the power supply and ground pins of a packaged integrated circuit. A current develops as electrostatic charges are discharged through the internal circuitry of the integrated circuit. A graph of electrostatic discharge current versus time in two illustrative HBM scenarios is shown in FIG. 1. The solid line 10 shows how sometimes a positive current may flow between the power supply and ground pins. The dotted line 12 shows how a negative current may flow between the power supply and ground pins.

Figure 2:
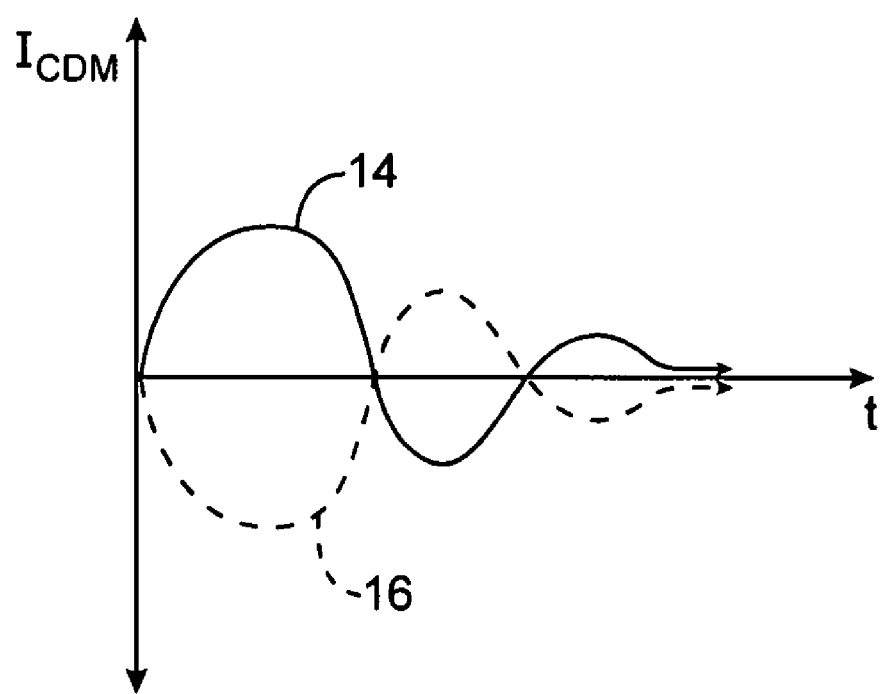
FIG. 2 is a graph showing typical current signals that may be produced due to electrostatic discharge arising from charge accumulation in an integrated circuit that discharges through a pin associated with the integrated circuit.

The charged device model (CDM) is applicable in situations in which a charge that has developed internally in the integrated circuit is released from the circuit. This scenario may arise, for example, when an integrated circuit is handled in a tray. Movement of the integrated circuit relative to the tray during normal handling may cause a positive or negative electrostatic charge to develop on the integrated circuit. When the circuitry of the integrated circuit is placed in contact with a source of ground potential (e.g., when a person touches a pin on the integrated circuit), the positive or negative charge on the integrated circuit discharges. The resulting signal rings, due to LRC effects, as shown in FIG. 2. The discharge current associated with a circuit that had developed a positive internal voltage is shown by solid line 14. The discharge current associated with a circuit that had developed a negative internal voltage is shown by dotted line 16.

In general, an integrated circuit may be exposed to any of the signals shown in FIGS. 1 and 2. A robust electrostatic discharge protection circuit should protect against damage in the integrated circuit, regardless of which particular type of signal is generated during the electrostatic discharge event.

Figure 3:
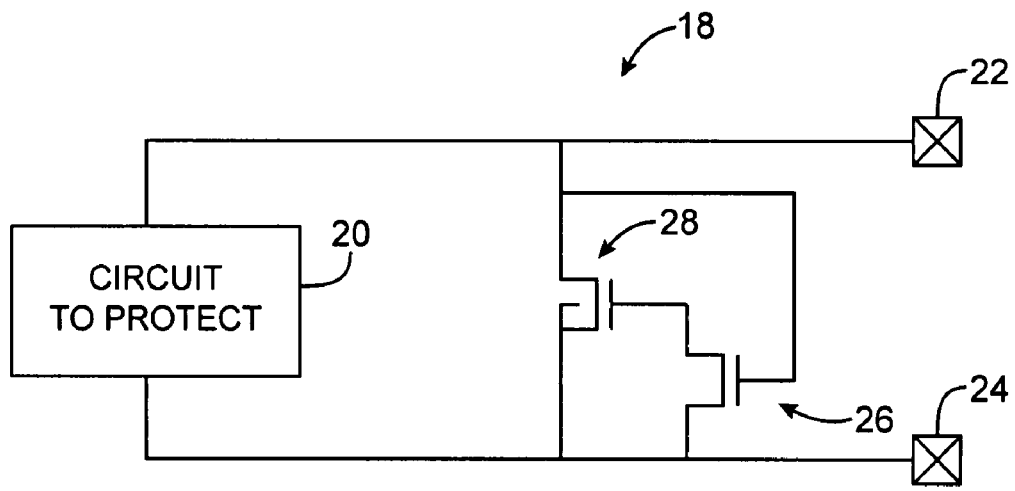
FIG. 3 is a circuit diagram of a conventional electrostatic discharge protection circuit.

A conventional electrostatic discharge (ESD) protection circuit 18 is shown in FIG. 3. In the arrangement of FIG. 3, a sensitive circuit 20 is connected between integrated circuit pins 22 and 24. Electrostatic discharge protection circuit 18 has n-channel metal-oxide semiconductor (NMOS) transistors 26 and 28. Transistors 26 and 28 form a circuit that attempts to shunt excessive current during electrostatic discharge events and thereby protect circuit 20.

The circuit of FIG. 3 may not work satisfactorily in certain situations. As an example, consider the CDM scenario in which a large positive voltage develops internally on an integrated circuit, which is then discharged through a ground pin. Even if transistor 28 turns on to shunt current away from fuses on the circuit, the presence of the large positive voltage could turn on NMOS fuse programming transistors if their sources have been grounded. Current may therefore flow through the fuses even though transistor 28 is conducting current.

In accordance with the present invention, electrostatic discharge protection circuitry is provided that is sufficiently robust to protect even sensitive circuit elements such as polysilicon fuses. The electrostatic discharge protection circuitry provides electrostatic discharge protection for positive and negative currents in both the HBM and CDM scenarios.

Figure 4A:
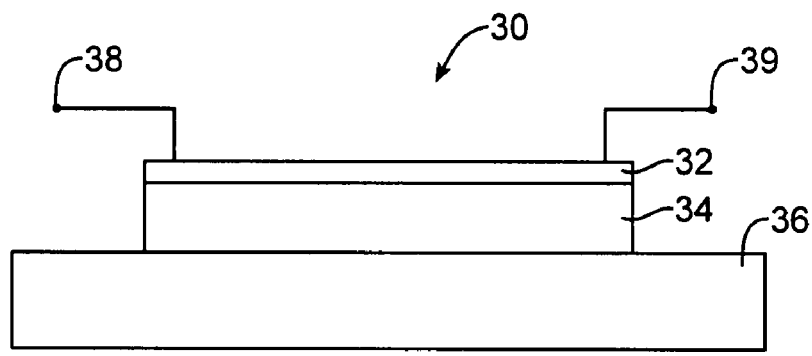
FIG. 4a is a side view of an illustrative unprogrammed polysilicon fuse in accordance with the present invention.

A cross-section of an illustrative polysilicon fuse 30 is shown in FIG. 4a. Fuse 30 has a layer of polysilicon 34 that is patterned into a line or other suitable structure on a substrate 36. Polysilicon 34 is typically coated with a silicide layer 32. Programming signals may be applied to the silicided polysilicon fuse 30 through terminals 38 and 39. When a programming signal is applied to terminals 38 and 39, a current flows through the fuse 30. Silicide 32 is significantly more conductive than polysilicon 34, so essentially all of the current flows through the silicide 32, rather than the polysilicon 34.

Figure 4B:
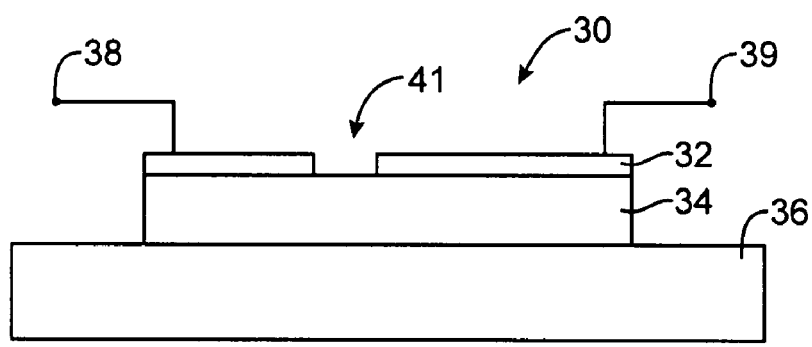
FIG. 4b is a side view of an illustrative programmed polysilicon fuse in accordance with the present invention.

When a sufficiently large current density develops in the silicide layer 32, effects such as electromigration cause a gap 41 to form, as shown in FIG. 4b. The gap in the silicide layer causes the resistance of fuse 30 to increase significantly. In this high-resistance state, the fuse 30 is said to be "programmed."

The resistance of the fuse 30 may increase by several orders of magnitude or more during programming. Sensing circuitry on the integrated circuit may sense the resistance of each fuse 30 and may convert each fuse's measured resistance into a corresponding digital logic signal. As an example, the sensing circuitry may produce a logic high for each programmed fuse and a logic low for each unprogrammed fuse. The high and low logic signals may be used by other circuitry on the integrated circuit (e.g., to perform various digital logic functions based on the states of the fuses).

Circuit elements such as the polysilicon fuse of FIGS. 4a and 4b are highly sensitive. A typical polysilicon fuses may be programmed upon application of 10 mA to 50 mA of current applied for 0.1 ms to 10 ms. When using sensitive circuit elements such as these, it is particularly important to avoid developing undesirable voltages and currents within the integrated circuit. Excessive voltages and currents might result in inadvertent programming of fuses (or antifuses) or could damage other sensitive circuit elements, even if these excessive voltage and currents are only present for a short time during an ESD event.

Figure 5:
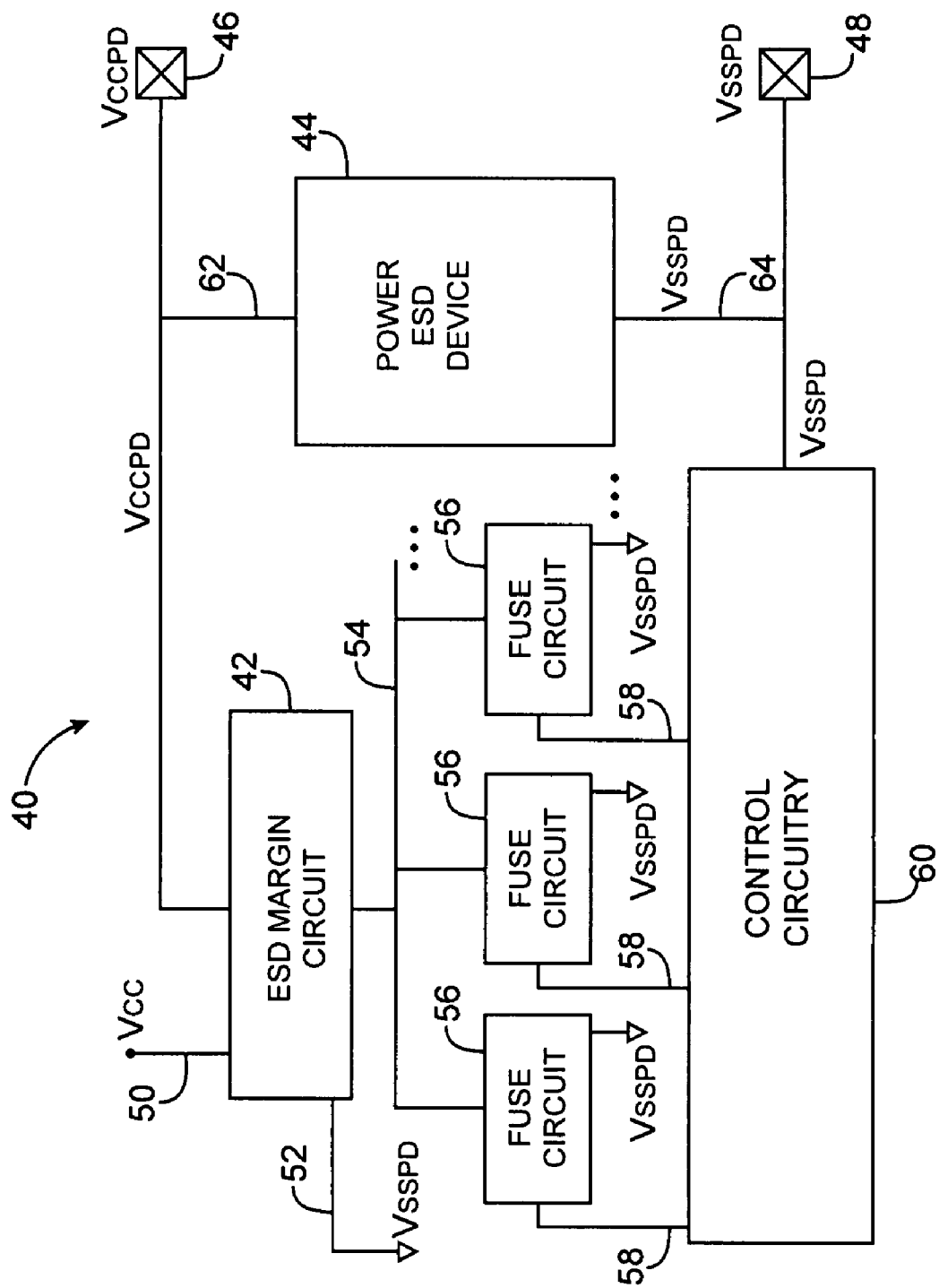
FIG. 5 is a circuit diagram of illustrative integrated circuit electrostatic discharge protection circuitry in accordance with the present invention.

In accordance with the present invention, electrostatic discharge protection circuitry is provided that can prevent inadvertent programming of fuses or antifuses and can protects other sensitive circuitry. Illustrative electrostatic discharge protection circuitry 40 is shown in FIG. 5. Circuitry 40 includes a power electrostatic discharge device 44 and an electrostatic discharge margin circuit 42. In the example of FIG. 5, the circuitry 40 is being used to protect fuses in fuse circuits 56. This is merely illustrative. Circuitry 40 may be used to protect antifuses or any other sensitive circuits on an integrated circuit if desired.

ESD circuit 42 may receive a voltage signal at Vcc (e.g., a core logic voltage supply level of 1.2 V) at line 50 and may receive a ground signal at Vsspd, as shown by line 52.

The power ESD device 44 is connected between a positive power supply pin 46 (Vccpd) and a ground power supply pin 48 (Vsspd) by conductive paths 62 and 64. During normal operation, pins 46 and 48 supply, for example, 3.3 V and 0 V signals, respectively. The ESD circuit 42 applies the 3.3 V signal from pin 46 to line 54. This positive power supply signal is applied to each fuse circuit 56. Control circuitry 60 is used to selectively program fuses in fuse circuits 56 using control lines 58. If, for example, it is desired to program the middle fuse of FIG. 5, the corresponding middle line 58 may be momentarily activated, thereby applying a programming current to the fuse in the middle fuse circuit 56 and changing that fuse from an unprogrammed to a programmed state.

The core logic voltage supply level Vcc is typically significantly lower than the voltage supply level used for input/output (I/O) circuitry on the integrated circuit. I/O circuits may be supplied with voltages on the order of 3.3 V (e.g., voltages like Vccpd), because these circuits must interface with external components that operate at higher voltages. The core logic generally operates at lower voltages (e.g., on the order of 1.2 V) to reduce power consumption. For example, control circuitry 60, which may be implemented as part of a logic core, may operate at 1.2 V. As a result, the control signals that are generated by control circuitry 60 and which are selectively applied to lines 58 may be generated at voltages that range between a logic low of Vsspd (0 V) and a logic high of Vcc (1.2 V).

The specific voltage levels described herein are merely illustrative. For example, as process technology evolves, it is expected that the voltage levels used in the logic core will decrease. I/O power supply levels may also decrease in the future. In general, any suitable voltages may be used. The voltages of 3.3 V and 1.2 V described in connection with circuitry 40 are used as an example.

Under HBM conditions, a positive or negative voltage may be applied across pins 46 and 48. This situation may arise, for example, when a person inadvertently touches pins 46 and 48. Under CDM conditions, a positive or negative voltage may develop on the internal components of FIG. 5, which is then discharged when a pin is grounded. For example, the internal electrostatic potential may be discharged through pin 48 when a person inadvertently touches pin 48 or when pin 48 is placed in contact with a grounded lab bench, etc.

The ESD protection circuitry 40 prevents current from flowing through any of the fuse circuits 56 even when the circuitry of FIG. 5 is exposed to unwanted ESD events. Power ESD device 44 acts as a current shunt for excessive current. Because current passes through device 44 when exposed to ESD, current is prevented from flowing through the fuse circuits 56. ESD circuit 42 provides an extra safety margin that is not available in conventional ESD circuit arrangements of the type shown in FIG. 3. The margin provided by ESD circuit 42 helps to ensure that the power ESD device 44 turns on and conducts current before any potentially damaging current flows through the sensitive circuit. Current is therefore prevented from flowing through fuse circuits 56 under all HBM and CDM conditions. With conventional arrangements of the type shown in FIG. 3, the ESD protection provided by transistors 26 and 28 can fail under certain ESD conditions, because current is not adequately prevented from flowing through the sensitive circuit.

In general, any suitable power ESD device 44 and ESD margin circuit 42 may be used in ESD circuitry 40. Typical modern integrated circuits are fabricated using metal-oxide-semiconductor (MOS) transistors such as n-channel MOS (NMOS) and p-channel MOS (PMOS) transistors, so circuitry 40 and devices 44 and 42 will be described in the context of MOS devices for clarity. MOS devices may be formed on any suitable substrate, including silicon-on-insulator (SOI) substrates, silicon substrates, substrates formed from other semiconductors, etc. If desired, ESD circuitry 44 may be formed using bipolar junction transistors (BJTs) or other suitable electrical devices.

If power ESD device 44 and ESD margin circuit 42 are based on MOS technology, device 44 and circuit 42 may include NMOS transistors, PMOS transistors, or combinations of NMOS and PMOS transistors. Any suitable circuit arrangements may be used to provide the current shunting and margin functions of circuits 44 and 42. An illustrative circuit arrangement that may be used for circuits 44 and 42 is shown in FIG. 6.

Figure 6:
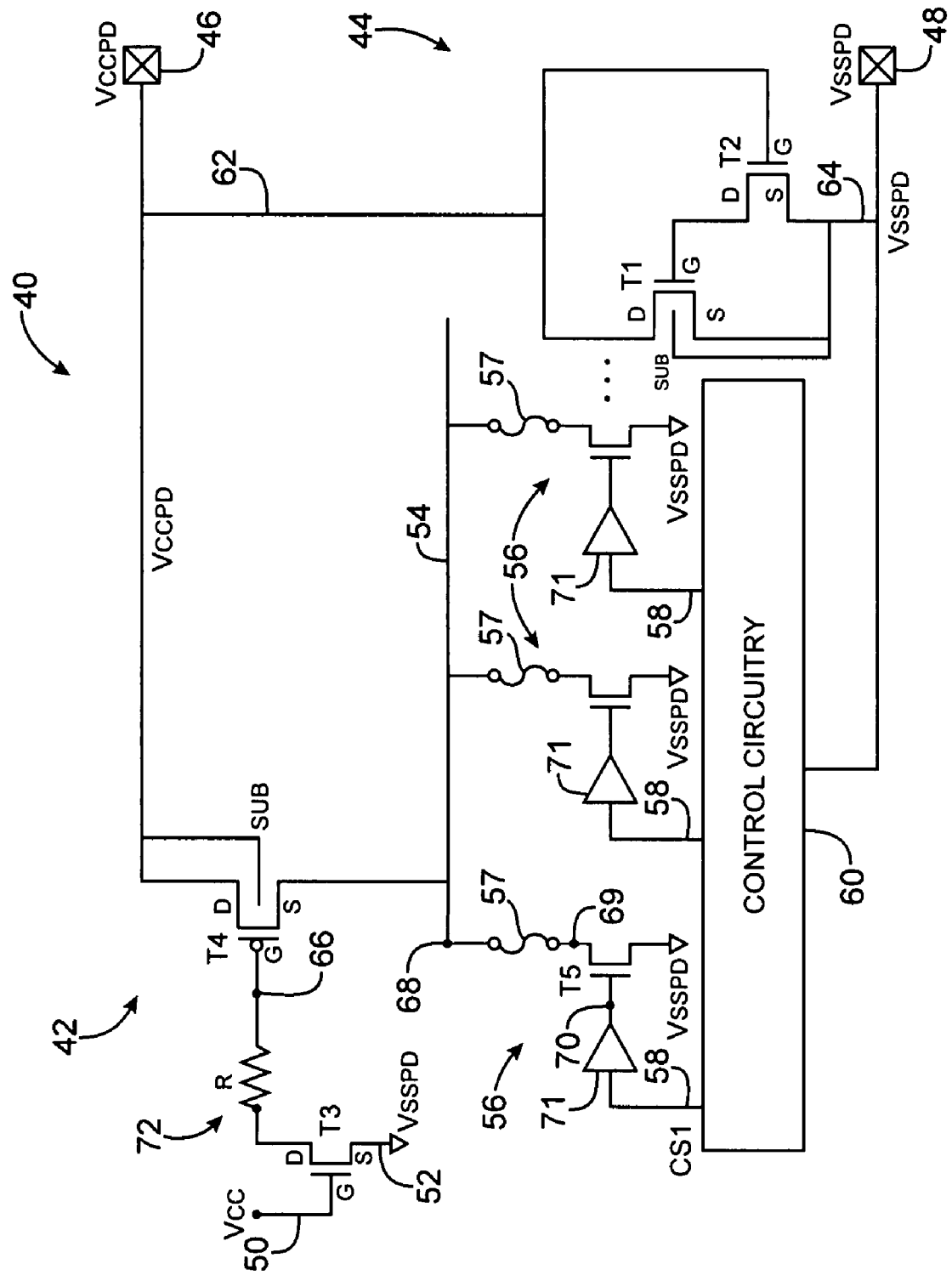
FIG. 6 is a more detailed circuit diagram showing illustrative integrated circuit electrostatic discharge protection circuitry in accordance with the present invention.

As shown in FIG. 6, power ESD device 44 (sometimes called an ESD shunt device) may include an NMOS transistor T1 and an NMOS transistor T2. In the present example, the threshold voltages of NMOS transistors such as transistors T1 and T2 may be about 0.4 V and PMOS transistors in the circuit may have a threshold voltage of about −0.4 V.

The gate (G) of transistor T2 and the drain (D) of transistor T1 may be connected to the positive power supply pin 46 by path 62. The sources (S) of transistors T1 and T2 may be connected to the ground power supply pin 48 by path 64. The substrate terminal (SUB) of transistor T1 may also be connected to pin 48. Transistor T2 provides a "soft ground" bias for the gate of transistor T1. When the voltage on the gate of transistor T2 is high (e.g., 3.3 V), the threshold voltage of transistor T1 is exceeded, which turns transistor T2 on. When T2 is on, there is a low resistance between its source and drain terminals. This forms a high-conductivity path between ground pin 48 and the gate G of transistor T1. Applying the ground potential Vsspd to T1's gate in this way turns off transistor T1 whenever the voltage on line 62 is high.

ESD margin circuit 42 may have an NMOS transistor T3 and a PMOS transistor T4. The substrate terminal of transistor T4 and transistor T4's drain terminal may be connected to the positive power supply pin 46. The source of transistor T4 may be connected to line 54. The gate of transistor T4 may be connected to one terminal of resistor 72. The other terminal of resistor 72 may be connected to the drain of transistor T3. Transistor T3 may be grounded at its source terminal S via line 52. The gate of transistor T3 may be biased using the core logic power supply Vcc applied through line 50. The biasing circuit formed using transistor T3 and resistor 72 turns transistor T3 on during power-up operations, which allows sensing circuitry on the integrated circuit to detect the states of fuse circuits 56. The size of the PMOS transistor T4 is preferably selected to ensure its series resistance is significantly lower than the resistance of the unprogrammed fuses in fuse circuits 56.

The size of the resistor 72 affects the discharge rate of the voltage on the gate of transistor T4. The size R of resistor 72 is preferably such that the gate of transistor T4 discharges more slowly than the gates of the fuse programming transistors in the fuse circuits 56. This ensures that transistor T4 will remain off sufficiently long to block current flow through the fuse circuits 56 during all ESD events (i.e., during positive-cycle CDM signal conditions).

During normal operation, transistor T3 is on, because the voltage Vcc is greater than the threshold voltage of the transistor T3 (e.g., 0.4V). Node 66 is therefore connected to ground (0V). Because node 66 is at ground, the gate G of transistor T4 is low, which turns the PMOS transistor T4 on. With transistor T4 on, there is a low resistance path between positive power supply pin 46 and node 68. Node 68 is therefore supplied with power at 3.3 V from pin 46. This positive power supply voltage is provided to each of the fuse circuits 56 via line 54. In general, there may be any suitable number of fuse circuits 56 in the integrated circuit. Three fuse circuits 56 are shown in FIG. 6 as an example.

While node 68 is at Vccpd, Vccpd is applied to ESD power device 44 by line 62. This causes the gate voltage of transistor T2 to be high, which turns on transistor T2. Turning on transistor T2 takes the gate of transistor T1 low. With the gate on T1 low, transistor T1 is off.

The control circuitry 60 may now be used to program the fuses 57 as desired. For example, if it is desired to program the fuse connected to transistor T5 in FIG. 6, the control circuitry 60 can generate a logic high signal CS1 on the appropriate line 58. The logic high signal on CS1 applies a programming current to the fuse connected to transistor T5.

Any suitable arrangement may be used for fuse circuits 56. Each fuse circuit 56 has an associated fuse 57. Fuses 57 may be silicided polysilicon fuses of the type described in connection with FIGS. 4*a* and 4*b* or any other suitable fuses. In the illustrative arrangement for fuse circuits 56 that is shown in FIG. 6, each fuse circuit 56 has a fuse 57 that has one terminal connected to line 54 and another terminal connected to the drain of an associated NMOS programming transistor (e.g., a transistor such as transistor T5). The source of the transistor is grounded by connection to pin 48 (Vsspd). The gate of the programming transistor in each fuse circuit 56 receives control signals from the control circuitry 60. When the control signal is low, the transistor is off and the fuse 57 remains in its unprogrammed state. When the control signal is high, the programming transistor turns on and current flows between the source of positive voltage (line 54) and the source of ground potential (e.g., the Vsspd pin 48 which is connected to the transistor's source).

With one suitable arrangement, control circuitry 60 operates at core voltage levels (0-1.2 V). A logic high at output CS1 therefore corresponds to a voltage of 1.2V. A logic low at output CS1 corresponds to a voltage of 0 V (Vsspd). In this type of situation, level shifters 71 may be used to boost the voltage level of the control signals. When the input to a level shifter 71 is 0 V, the output of the level shifter 71 is 0V. When the input to a level shifter 71 is 1.2 V, the output of that level shifter 71 is 3.3 V (as an example). The level shifters 71 adjust the voltages of the control signals provided by control circuitry 60 sufficiently that these control signals can be used to turn on and off the programming transistors such as transistor T5.

In a typical programming scenario, the control circuitry turns on a desired transistor such as transistor T5 by taking its associated control line (CS1 in the example of FIG. 6) high. Turning on T5 applies a ground potential to node 69, because the source of transistor T5 is connected to the ground pin 48. With a voltage of 3.3 V at node 68 (because T4 is on during normal operation) and a voltage of 0 V at node 69 (because T5 is on), sufficient current flows through the fuse 57 that the fuse 57 is programmed. The user can program any desired fuses 57 on the integrated circuit using this technique.

During ESD events, electrostatic charges can create abnormally high voltages and currents.

When a transistor such as transistor T1 is exposed to high voltages across its drain and substrate terminals, the transistor can break down and pass current. This effect may be understood with reference to FIGS. 7, 8, and 9.

Figure 7:
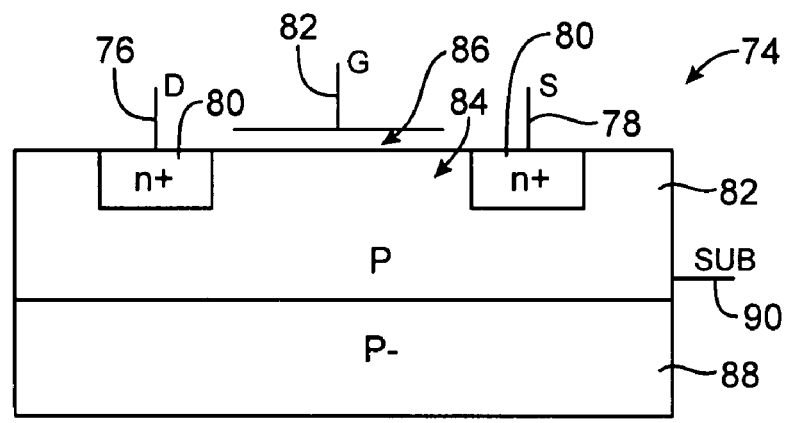
FIG. 7 is a side view of an illustrative n-channel metal-oxide-semiconductor (NMOS) transistor that may be used in electrostatic discharge protection circuitry of the type shown in FIG. 5 and FIG. 6 in accordance with the present invention.

A cross-sectional diagram of a typical NMOS transistor 74 is shown in FIG. 7. Transistor 74 may have a drain terminal 76 and source terminal 78. The drain and source terminals may be connected to highly doped n-type regions 80. Regions 80 lie in a p-type well 82 on a lightly doped (p−) substrate 88. The substrate terminal 90 (SUB) is connected to region 82. The transistor's gate terminal 82 is separated from the channel region 84 of the transistor 74 by an insulating dielectric layer 86.

Figure 8:
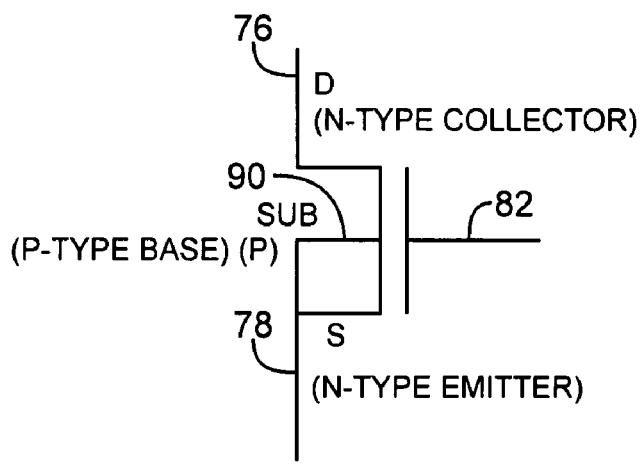
FIG. 8 is a schematic diagram of the transistor of FIG. 7 showing how the transistor can operate as a parasitic n-p-n transistor.

In breakdown, the MOS transistor 74 can be modeled as a parasitic npn bipolar junction transistor. As shown in FIG. 8, in this situation, the n-type drain serves as a bipolar collector, the n-type source serves as a bipolar emitter, and the p-type substrate serves as a bipolar base. When a positive voltage is applied to the drain and a negative voltage (or less positive) voltage is applied to the substrate, the drain-substrate junction acts as a reverse-biased diode.

Figure 9:
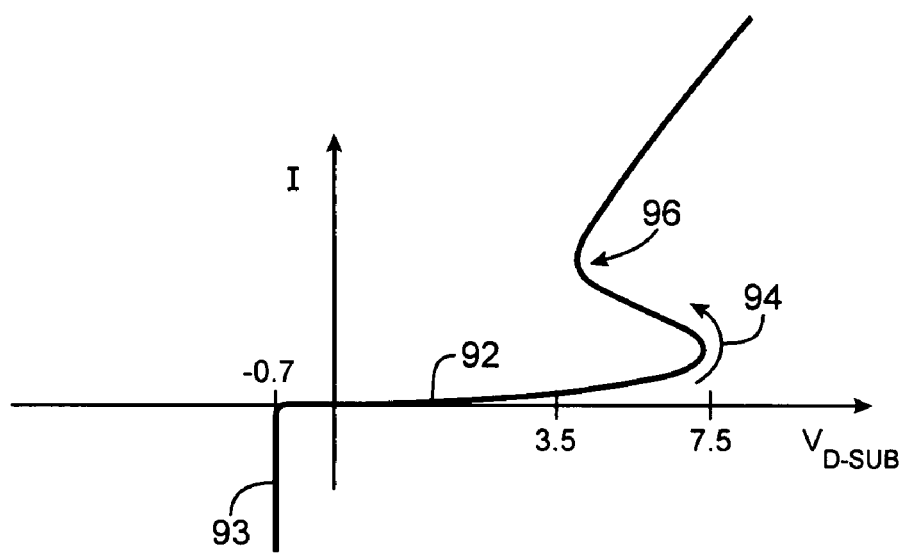
FIG. 9 is a graph showing an illustrative current-voltage characteristic for a transistor of the type shown in FIGS. 7 and 8 in accordance with the present invention.

As shown in FIG. 9, when the voltage between drain and substrate $V_{D-SUB}$ is low enough (i.e., in region 92), the current I that passes through the transistor 74 is low. However, when the voltage $V_{D-SUB}$ exceeds a trigger voltage $V_{TRIG}$ of about 7.5 V, the transistor breaks down. In particular, the reverse bias current through the drain-substrate diode injects a sufficiently large number of carriers (holes) into the "base" of the parasitic npn transistor that the npn transistor is turned on. This causes the current that passes through the transistor to increase dramatically, as shown by line 94 in FIG. 9. In its steady state, the transistor typically settles into operation in region 96 (i.e., at a reverse voltage of about 3.5 V).

When the voltage between the drain and substrate is negative (and at least −0.7 V), the substrate-drain junction acts as a forward-biased diode and conducts current I, as shown by region 93.

As demonstrated by FIGS. 7, 8, and 9, an MOS transistor such as transistor T1 of FIG. 6 may act as a type of "safety valve." If the voltage across terminals 46 and 48 exceeds the trigger voltage (7.5 V) or the p-n junction turn-on voltage (−0.7 V) due to an ESD event, the transistor T1 (and therefore the ESD power device 44) will divert ESD current harmlessly away from the sensitive devices such as fuse circuits 56.

The way in which the circuit components in ESD circuitry 40 respond to ESD events varies depending on the type of ESD event in question.

Figure 10:
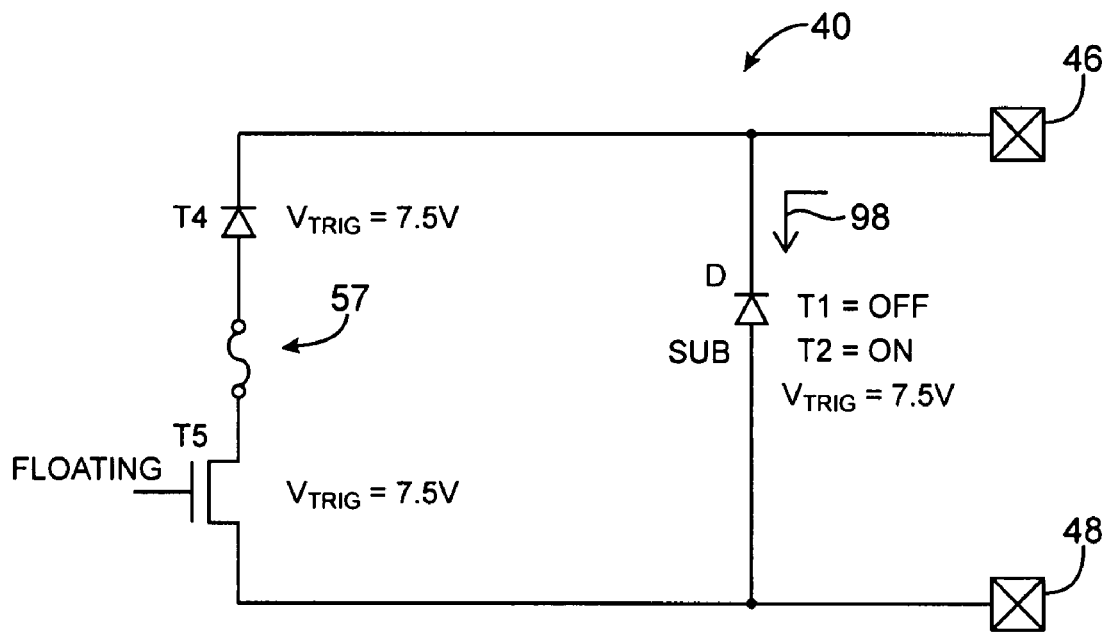
FIG. 10 is a diagram showing how the circuitry of FIG. 6 may protect against electrostatic discharge when a positive voltage is applied across two of its pins in accordance with the present invention.

The response of circuitry 40 when exposed to a positive voltage signal across terminals 46 and 48 in a positive polarity HBM event is shown in FIG. 10. In this situation, a large positive voltage is applied to terminal 46 while terminal 48 is grounded. The applied signal is as shown by line 10 of FIG. 1.

Under these conditions, the transistors T1, T2, T4 and T5 operate as shown in FIG. 10. Because the gate of transistor T2 is exposed to a large positive voltage, transistor T2 is on. This connects the gate of transistor T1 to ground. When a voltage in excess of the trigger voltage $V_{TRIG}$ (7.5 V) is applied across the drain-substrate terminals of transistor T1 while the gate of transistor T1 is grounded, transistor T1 is exposed to a sufficiently large voltage to break down as described in connection with FIGS. 7, 8, and 9. When T1 (and therefore power device 40) experiences breakdown, ESD current is diverted though transistor T1, as shown by arrow 98. The voltage across terminals 46 and 48 never exceeds the trigger voltage (e.g., 7.5 V), because the current-voltage characteristic of ESD power device 44 is as shown by the graph of FIG. 9.

Because the ESD power device 44 prevents the maximum voltage across terminals 46 and 48 from exceeding the trigger voltage $V_{TRIG}$, the voltage across series-connected transistor T4, fuse 57, and transistor T5 does not exceed $V_{TRIG}$. To experience reverse breakdown, transistor T4 and transistor T5 would both need to exceed their associated trigger voltages (i.e., the combined voltage across T4 and T5 would need to exceed 7.5 V+7.5 V=15 V). In the present situation, the voltage across T4 and T5 will not exceed 15 V because transistor T1 is limiting the maximum voltage to 7.5 V. As shown in this example, the extra voltage that would be required to turn on the reverse breakdown mechanism in transistor T4 serves as a source of additional safety margin. The extra margin provided by transistor T4 of ESD margin circuit 42 therefore helps to ensure that no current passes through fuse 57 during the ESD event. If circuit 42 and transistor T4 were not present, transistor T5 might break down at 7.5 V and cause unwanted current to flow through fuse 57.

Figure 11:
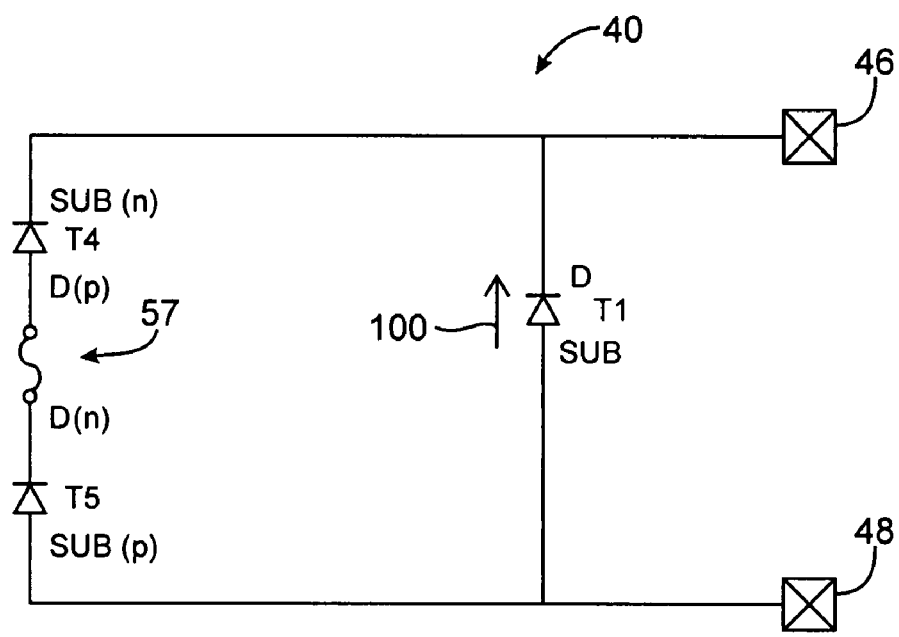
FIG. 11 is a diagram showing how the circuitry of FIG. 6 may protect against electrostatic discharge when a negative voltage is applied across two of its pins in accordance with the present invention.

The response of circuitry 40 when exposed to a negative voltage signal across terminals 46 and 48 in a negative polarity HBM event is shown in FIG. 11. In this situation, a negative voltage (e.g., a voltage of less than −0.7 V) is applied to terminal 46 while terminal 48 is grounded. The applied signal is as shown by line 12 of FIG. 1.

Under these conditions, the transistors of circuitry 44 operate as shown in FIG. 11. Because the gate of transistor T2 is exposed to a negative voltage, transistor T2 is off. The gate of transistor T1 is therefore floating. The drain of transistor T1 is at least 0.7 V lower in voltage than the substrate terminal of transistor T1, so transistor T1 acts as a forward biased diode and draws the ESD current away from fuse 57, as shown by line 100 in FIG. 11.

The diode formed by the substrate and drain terminals of T1 effectively limits the maximum voltage across terminals 46 and 48 to −0.7 V. The transistors T4 and T5, which are connected in series with fuse 57, may also be viewed as diodes under these conditions. Each diode (T4 and T5) would require at least −0.7 V to turn on. Because T4 and T5 are connected in series, a total of −1.4 volts would be required across pins 46 and 48 before any appreciable current would flow through T4 and T5. Transistor T4 provides an extra 0.7 V of margin to transistor T5. T1 clamps the voltage drop at −0.7 volts, so the diodes of T4 and T5 will never turn on. This prevents the unwanted programming of fuse 57.

Sometimes the internal components on the integrated circuit acquire a static charge that is discharged through one of the pins of the circuit to the external environment (e.g., a person or a lab bench acting as a ground). The charged device model (CDM) is applicable in this type of situation.

Figure 12:
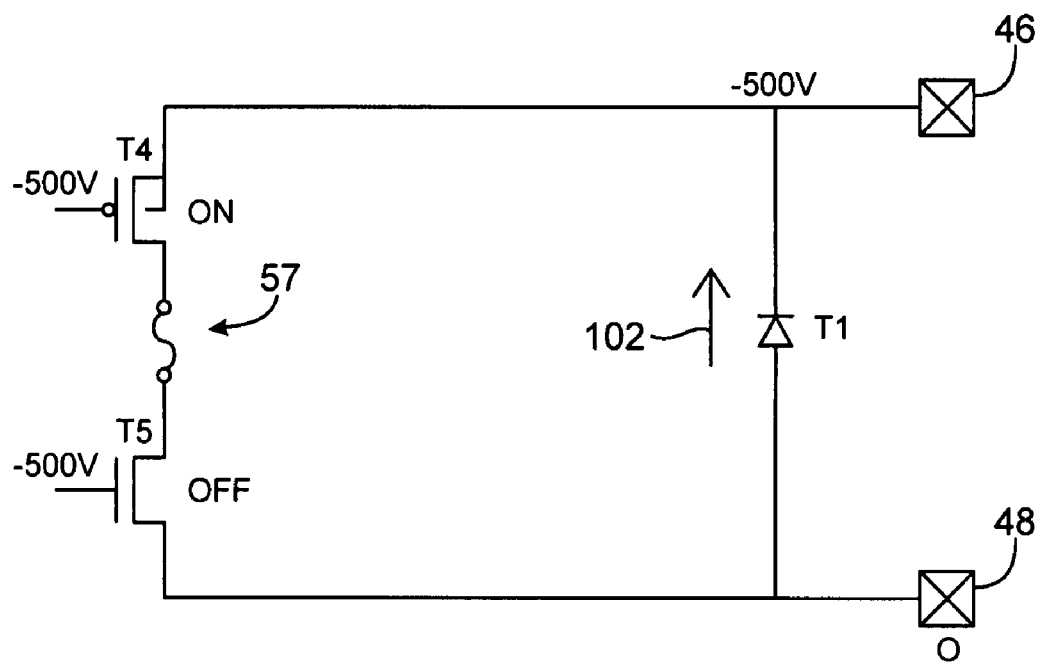
FIG. 12 is a diagram showing how the circuitry of FIG. 6 may protect against electrostatic discharge due to a negative voltage generated within an integrated circuit in accordance with the present invention.

The charge that develops internally may be positive or negative. The response of the ESD protection circuitry 44 when a negative internal voltage is released by grounding of the ground pin 48 is shown in FIG. 12. The response of the ESD protection circuitry 44 when a positive internal voltage is released by grounding pin 48 is shown in FIG. 13.

As shown in FIG. 12, a negative voltage (e.g., a voltage of −500 V may accumulate on the internal circuit components of the integrated circuit due to static buildup (e.g., because the package of the integrated circuit is being moved about in a tray or other carrier that creates static). With a voltage of −500 V on its gate, PMOS transistor T4 is turned on. However, transistor T5 is an NMOS transistor, which is turned off by the voltage of −500 V that has accumulated at its gate. Because transistor T5 is off, current cannot flow through fuse 57. Transistor T1 experiences a voltage of −500 V at its drain and a voltage of 0 V at its substrate, which is connected to the external ground at pin 48. As a result, transistor T1 is forward biased and diverts ESD current away from fuse 57.

Because current is prevented from flowing through fuse 57 by transistor T5 and is drawn instead through ESD power device 44 as shown by line 102, fuse 57 is protected.

Figure 13:
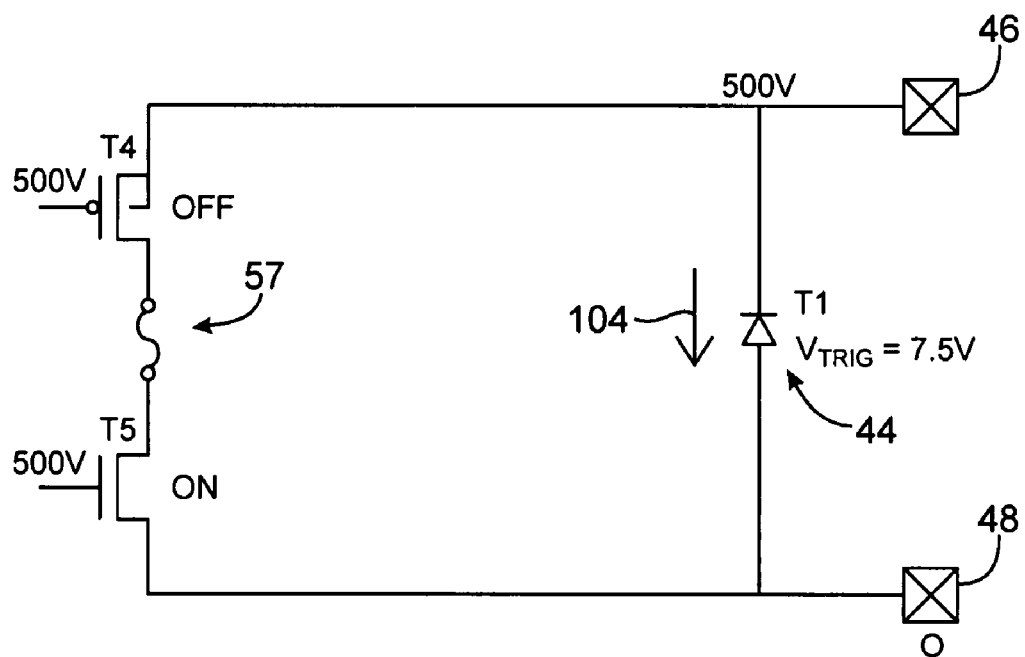
FIG. 13 is a diagram showing how the circuitry of FIG. 6 may protect against electrostatic discharge due to a positive voltage generated within an integrated circuit in accordance with the present invention.

When positive charge builds up internally, the response of the ESD circuitry 44 is as shown in FIG. 13. As shown in FIG. 13, this type of event is characterized by large internal voltages (e.g., a voltage of 500 V). With a voltage of 500 V at its gate, NMOS transistor T5 is on. However, transistor T4, which is a PMOS transistor, is turned off by the 500 V signal at its gate. At the same time, transistor T1 breaks down and conducts ESD current as soon as T1's trigger voltage $V_{TRIG}$ is exceeded. The ESD current, which is shown by line 104, passes harmlessly through the ESD device 44. Device 44 is preferably sized sufficiently large to handle large ESD currents. As shown in FIG. 13, while transistor T1 carries the ESD current, transistor T4 is biased strongly off by the 500 V signal on its gate, thereby preventing current from flowing through fuse 57. The current blocking capability of transistor T4 under the CDM scenario of FIG. 13 is unavailable with conventional ESD circuits such as the circuit of FIG. 3.

In the CDM scenario, the internal charge of the integrated circuit discharges into an external body. The inductance (L), resistance (R), and capacitance (C) of the object into which the circuit discharges affect the discharge current. Typically LRC effects produce ringing in the discharge current as shown by FIG. 2. A circuit that initially discharges with a positive polarity has the discharge characteristic given by line 14. A circuit that initially discharges with a negative polarity has the discharge characteristic given by line 16.

The size of resistor 72 is preferably selected such that during a positive CDM cycle, the positive voltage on the gate of transistor T4 that is holding transistor T4 off remains in place longer than the positive voltage on the gate of transistor T5 that is turning transistor T5 on. This ensures that transistor T4 will remain off while T5 is on during the positive-current cycle. (Once in the negative-current cycle of the CDM signal, the transistor T5 will be off, so there will be no risk of current flowing through fuse 57 due to a discharge of T4's gate.)

As described in connection with FIGS. 10, 11, 12, and 13, the ESD circuitry 44 protects fuses 57 under a variety of ESD conditions by blocking current flow through the fuses 57 while drawing ESD current through ESD power device 44. The ESD margin circuit 42 helps to ensure that current will not flow through the fuses 57 and the programming transistors such as transistor T5.

The foregoing is merely illustrative of the principles of this invention and various modifications can be made by those skilled in the art without departing from the scope and spirit of the invention.

What is claimed is:
1. An integrated circuit with electrostatic discharge (ESD) protection circuitry, comprising:
   a first pin;
   a second pin;

a power ESD device connected between the first pin and the second pin;
a conductive line;
a control circuit;
a plurality of fuses, each of which is connected between the conductive line and the control circuit, wherein the control circuit selectively programs the fuses by selectively connecting the fuses to the first pin; and
an ESD margin circuit connected between the second pin and the conductive line that helps to ensure that the power ESD device turns on under ESD conditions and conducts current before any potentially damaging current flows through the fuses.

2. The integrated circuit defined in claim 1 wherein the ESD margin circuit comprises a transistor.

3. The integrated circuit defined in claim 1 wherein the ESD margin circuit comprises a p-channel metal-oxide-semiconductor transistor.

4. The integrated circuit defined in claim 1 wherein the ESD margin circuit comprises a transistor having a first terminal connected to the second pin and a second terminal connected to the conductive line.

5. The integrated circuit defined in claim 1 wherein the ESD margin circuit comprises a transistor having a first terminal connected to the second pin, a second terminal connected to the conductive line, and a third terminal that is biased at a predetermined voltage.

6. The integrated circuit defined in claim 1 wherein the control circuit comprises a plurality of transistors and wherein each of the transistors is connected between a respective one of the fuses and the first pin.

7. The integrated circuit defined in claim 1 wherein the control circuit comprises a plurality of transistors, wherein each of the transistors is connected between a respective one of the fuses and the first pin, and wherein each of the transistors has a gate to which a control signal is applied when it is desired to turn on that transistor and program the fuse that is connected to that transistor.

8. The integrated circuit defined in claim 1 wherein the first pin comprises a ground pin.

9. A method of using an integrated circuit that has electrostatic discharge (ESD) protection circuitry to protect a plurality of fuses on the integrated circuit from damage, wherein the integrated circuit has a first pin, a second pin, a conductive line, a control circuit, and a plurality of fuses each of which is connected between the conductive line and the control circuit, the method comprising:
    with the control circuit, selectively programming the fuses by selectively connecting the fuses to the first pin;
    with a power ESD device that is connected between the first pin and the second pin, allowing current to flow in an ESD event to protect the plurality of fuses from damage; and
    with an ESD margin circuit that is connected in series with the fuses, preventing potentially damaging current from flowing through the fuses by ensuring that the power ESD device turns on under ESD conditions and conducts current before the potentially damaging current flows through the fuses.

10. The method defined in claim 9 wherein the ESD margin circuit comprises a transistor having a first terminal connected to the second pin and a second terminal connected to the conductive line, the method comprising:
    with the transistor, preventing potentially damaging current from flowing through the fuses under ESD conditions.

11. The method defined in claim 9, wherein the control circuit comprises a plurality of transistors, wherein each of the transistors is connected between a respective one of the fuses and the first pin, and wherein selectively programming the fuses by selectively connecting the fuses to the first pin comprises selectively turning on the transistors.

* * * * *